United States Patent [19]

Abe et al.

[11] Patent Number: 4,462,856
[45] Date of Patent: Jul. 31, 1984

[54] SYSTEM FOR ETCHING A METAL FILM ON A SEMICONDUCTOR WAFER

[75] Inventors: Masahiro Abe, Yokohama; Toshio Yonezawa, Yokosuka; Masaharu Aoyama, Fujisawa; Takashi Ajima, Kamakura, all of Japan

[73] Assignee: Tokyo Shibaura Denki Kabushiki Kaisha, Japan

[21] Appl. No.: 467,298

[22] Filed: Feb. 17, 1983

[30] Foreign Application Priority Data

Feb. 18, 1982 [JP] Japan .................... 57-25012

[51] Int. Cl.³ .............. C23F 1/02; C25F 3/04; C25F 3/12
[52] U.S. Cl. .................... 156/345; 156/627; 156/665; 204/129.2; 204/129.3; 324/71.5
[58] Field of Search .............. 204/129.2, 129.3, 406; 324/71.5; 156/626, 627, 345, 665

[56] References Cited

U.S. PATENT DOCUMENTS

| | | | |
|---|---|---|---|
| 3,755,026 | 8/1973 | Reynolds | 324/71.5 X |
| 3,874,959 | 4/1975 | Hoekstra et al. | 204/129.2 X |
| 3,943,043 | 3/1976 | Billington et al. | 204/129.2 X |
| 4,058,438 | 11/1977 | Russell | 204/129.2 X |
| 4,229,264 | 10/1980 | Graunke | 156/627 X |
| 4,336,111 | 6/1982 | Graunke | 156/627 X |
| 4,338,157 | 7/1982 | Kanda | 156/627 |

Primary Examiner—Donald R. Valentine
Attorney, Agent, or Firm—Finnegan, Henderson, Farabow, Garrett & Dunner

[57] ABSTRACT

A system is adapted to etch an aluminium film on a semiconductor wafer into a predetermined pattern by immersing the film in an etching solution. The system comprises a voltage detecting circuit for detecting a voltage created between a platinum electrode and the aluminium film on the semiconductor wafer which are immersed in the etching solution, a comparator for comparing a reference voltage with the voltage detected by the voltage detecting circuit to produce an output signal, and a timer for starting a time count operation upon receipt of the output signal from the comparator and for producing an etching completion signal when it continuously receives the output signal from the comparator for a predetermined time period.

3 Claims, 6 Drawing Figures

F I G. 1A
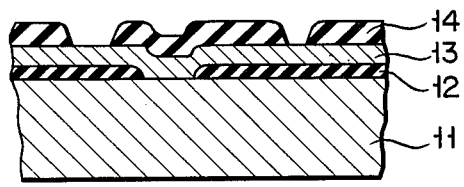
F I G. 1B
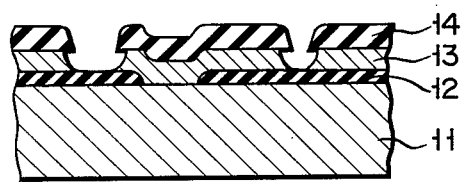
F I G. 2
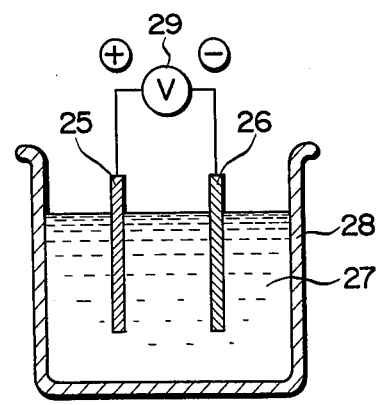

SYSTEM FOR ETCHING A METAL FILM ON A SEMICONDUCTOR WAFER

BACKGROUND OF THE INVENTION

This invention relates to a system for etching a metal film formed on a semiconductor wafer in a predetermined pattern.

In general, two kinds of metal are used as an electrode or an interconnection film for a semiconductor device: a metal with a high melting point or low resistivity, such as an aluminium alloy, molybdenum or tungsten, and a noble metal of low resistivity, such as platinum or gold. The steps of forming an electrode or an interconnection film by using these metals will be explained below by referring to FIGS. 1A and 1B.

As shown in FIG. 1A, the metal is evaporated, under electron beams or by sputtering, etc., on a predetermined pattern of an $SiO_2$ film 12 on a semiconductor wafer to form a metal film 13. After a photoresist is coated on the metal film 13, patterning is performed to form a photoresist film as shown in FIG. 1A. Then, the semiconductor structure is immersed in an etching solution to etch the metal film with the photoresist film 14 as a mask. In this way patterning is performed as shown in FIG. 1B. The etching of the metal film 13 progresses with time. In order to properly etch the metal film in a predetermined pattern, it is necessary that the semiconductor structure be raised from the etching solution immediately after the patterning is completed. That is, it is important to know the exact time at which the metal film 13 is etched in the predetermined pattern. The completion of the etching operation is judged either visually or by initially performing tests using test pieces to find a relation of the etching time to the depth of etching and automatically ending an etching operation in an actual etching process on the basis of such a relation. In order to visually determine the depth of etching, it is necessary to raise the semiconductor structure frequently out of the solution to see whether or not the etching process is completed. This process is not only time-consuming, but also complicated. The depth of etching depends greatly upon the temperature of the etching solution. In the automatic etching completion method, it is necessary to control the temperature of the etching solution very accurately, i.e., with an allowable temperature variation range of ±0.5° C. Furthermore, the deterioration of the etching solution and a variation in the thickness of the metal film to be etched also complicate the operation.

SUMMARY OF THE INVENTION

It is accordingly the object of this invention to provide a system for automatically and accurately etching a metal film on a semiconductor wafer into a predetermined pattern.

BRIEF DESCRIPTION OF THE DRAWINGS

FIG. 1A and 1B are cross sections showing a semiconductor device in a manufacturing process;

FIG. 2 is a view showing part of an apparatus to which an etching system of this invention is applied;

DETAILED DESCRIPTION OF THE PREFERRED EMBODIMENT

Figure 3:
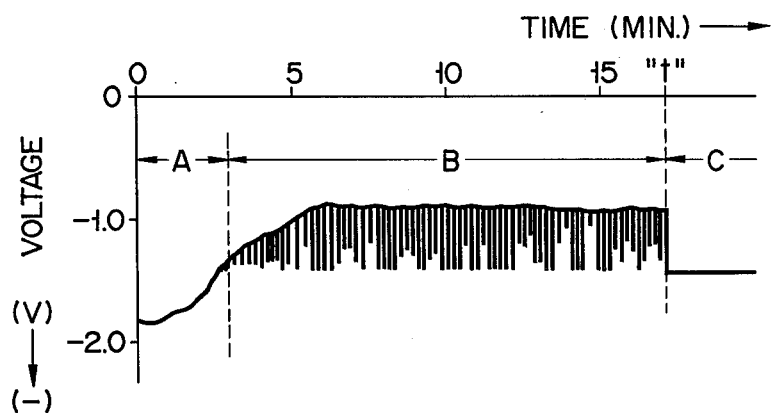
FIG. 3 shows a curve showing the voltage variation between a metal electrode and a metal film on a semiconductor wafer when both are immersed in an etching solution.

In FIG. 2, reference numeral 25 shows a piece of platinum; 26, a piece of aluminium; 27, a solution for etching the aluminium piece; 28, a vessel; and 29, a voltmeter. The vessel 28 holds an etching solution for etching the aluminium piece. The platinum piece 25 and aluminium piece 26 are immersed in the etching solution with a proper distance therebetween. A voltage difference is created between the platinum piece 25 and the aluminium piece 26. In order to detect the voltage difference the voltmeter 29 has its positive terminal connected to the platinum piece 25 and its negative terminal connected to the aluminium piece. If two kinds of metals are immersed in an acid solution or an alkaline solution, a voltage difference determined by the kinds of metals or the temperature of the solution is created between both the metals. If in FIG. 2 a solution consisting of $H_3PO_4$, $HNO_3$, $CH_3COOH$ and $H_2O$ in a ratio of 16:1:1:2 is used as an etching solution, a voltage difference of about 1.4 V is created between the platinum piece 25 and the aluminium piece 26. When a semiconductor structure obtained by forming a pattern of the photoresist film 14 on the aluminium film 13 overlying the semiconductor wafer 11 as shown in FIG. 1A is immersed in the solution in place of the aluminium piece 26, a time-varying voltage difference is created between the platinum piece 25 and the aluminium film 13 as shown in FIG. 3. A greater voltage difference of about $-1.8$ V is created at the start of etching as indicated by A in FIG. 3. After being gradually decreased, it becomes a predetermined level of about $-0.9$ V for a predetermined time period as indicated by B in FIG. 3 and then momentarily varies down to about $-1.4$ V. This value is maintained as indicated by C in FIG. 3. The range as indicated by A in FIG. 3 corresponds to a voltage variation when an alumina ($Al_2O_3$) film on the surface of the aluminium film is etched. The voltage difference decreases with time. The range as indicated by B in FIG. 3 corresponds to a voltage variation when the aluminium film 13 is normally etched. In this range, a voltage difference varies from about $-1.4$ V to about $-0.9$ V due to the evolution of hydrogen from the aluminium film 13. The range as indicated by C in FIG. 3 corresponds to a voltage difference when the aluminium film 13 is etched in a predetermined pattern, the voltage difference being maintained to about $-1.4$ V. The reason why the voltage difference is maintained at a constant level is that the aluminium film 13 is etched into contact with the $SiO_2$ film 12 with the result that the evolution of hydrogen stops. The time "t" in FIG. 3 corresponds to the time at which the metal film 13 is etched in a predetermined pattern, i.e., the etching operation is completed.

According to this invention, emphasis is placed on the variation of the voltage difference created between a proper electrode metal piece and a metal film on the semiconductor wafer immersed in the etching solution. By detecting a variation in the voltage difference, the etching completion time can be detected so that an automatic and accurate etching operation can be performed.

Figure 4:
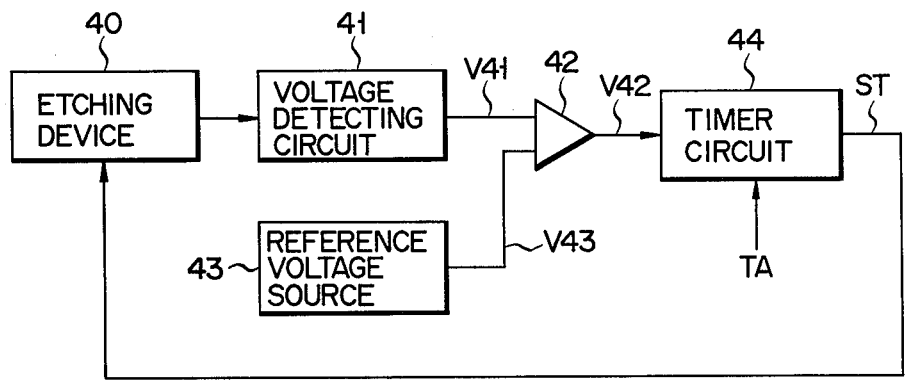
FIG. 4 is a block diagram showing an etching system according to one embodiment of this invention.

FIG. 4 is a block diagram showing the etching system of this invention.

In an etching device 40, the platinum electrode 25 and semiconductor wafer having an aluminium film 13 on the surface thereof are immersed in the solution 27 in the vessel 28. The solution has a composition consisting of $H_3PO_4$, $HNO_3$, $CH_3COOH$ and $H_2O$ in a ratio of 16:1:1:2. A voltage difference to be produced between the platinum electrode 25 and the aluminium film 13 on the wafer 11 is detected by a voltage detecting circuit 41 comprised of a voltmeter 29. A detected voltage $V_{41}$ is applied to one input terminal of a comparator 42. A reference voltage $V_{43}$ of a reference voltage source 43 is applied to the other input terminal of the comparator 42. The comparator 42 produces a signal $V_{42}$ when a detection output voltage $V_{41}$ of the voltage detection circuit 41 exceeds the reference voltage $V_{43}$. The comparison output $V_{42}$ of the comparator 42 is supplied to a timer circuit 44 which functions as a time count means.

The timer circuit 44 has a count time set by a count time setting signal TA and starts a time counting operation upon receipt of the output signal $V_{42}$ from the comparator 42. When the output signal $V_{42}$ of the comparator 42 continues for a predetermined time period, the timer circuit 44 delivers an etching completion signal ST to the etching circuit 40, ending the etching operation. In FIG. 4, the etching completion signal ST is supplied from the timer circuit 44 directly to the etching device 40. In actual practice, a driving device for raising the wafer 11 from the solution may be provided and, in this case, the etching completion signal ST can be used as an operation start signal to the driving device. Alternatively, a buzzer or a light emitting diode may be provided and, in this case, the etching completion signal ST is supplied to it to announce the completion of the etching operation to the operator. The operator can raise the semiconductor wafer 11 from the solution when such a display is made.

The operation of the etching system will be explained below.

First, a voltage difference is detected between the platinum electrode 25 and the aluminium film 13 of the semiconductor wafer 11. The detected voltage difference $V_{41}$ is fed to one input terminal of the comparator 42. A reference voltage $V_{43}$ is supplied from the reference voltage source 43 to the other input terminal of the comparator 42. The reference voltage $V_{43}$ is determined based on various factors such as the kinds of the electrode metals, kinds of metals to be etched and constituents of the etching solution. If the platinum as the electrode metal and aluminium as a metal to be etched are immersed in the etching solution consisting of $H_3PO_4$, $HNO_3$, $CH_3COOH$ and $H_2O$ in a ratio of 16:1:1:2, the reference voltage is determined to be about $-1.35$ V. The reason why the reference voltage is determined to be about $-1.35$ V, a level somewhat smaller than the reference voltage, is that, as shown in FIG. 3, the voltage difference between the metal electrode 25 and the aluminium film 13 is about $-1.4$ V when the aluminium film 13 is etched in a predetermined pattern, and so it is only necessary for the comparator 42 to detect that the detection voltage $V_{41}$ of the voltage detecting circuit 41 exceeds the reference voltage. The comparator 42 compares the detection voltage $V_{41}$ with the reference voltage $V_{43}$ and, when the output voltage $V_{41}$ of the voltage detecting circuit 41 becomes greater than the reference voltage $V_{43}$, it delivers a comparison signal $V_{42}$ to the timer circuit 44. The timer circuit 44 starts a time count operation upon receipt of the comparison signal $V_{42}$ and continues the time count operation only for a time period set by the setting signal TA as long as the comparison signal $V_{42}$ is supplied to the timer circuit. However, when the comparison signal $V_{42}$ disappears en route, the timer circuit 44 stops the time counting operation even within the set time period, and is then reset. When the timer circuit 44 continues the time counting operation for the predetermined time period, i.e., the comparison signal $V_{42}$ is continuously supplied from the comparator 42 to the timer circuit 44 for the set time period, the timer circuit 44 delivers an etching completion signal ST to the etching device, ending the etching operation.

During the etching operation, the voltage varies as shown in FIG. 3 and there exits a time at which said voltage exceeds $-1.35$ V even before the etching completion time. At time "t", the voltage becomes about $-1.4$ V at which point the etching operation is ended, but in the voltage range as indicated by B in FIG. 3 there exists a time at which the voltage exceeds $-1.35$ V, though only for a brief period. It is therefore impossible to identify the completion of the etching operation by merely comparing the reference voltage with the output voltage of the voltage detecting circuit. In order to identify the completion of the etching operation, it is necessary to detect whether or not the voltage exceeding $-1.35$ V continues for the predetermined time period. Thus, the timer circuit 44 is provided to check the completion of the etching operation; that is, it judges whether or not the voltage exceeding $-1.35$ V continues for the predetermined time period. Now suppose that the setting time of the timer circuit 44 is, for example, 3 seconds. If, in this case, the timer circuit 44 continuously receives the comparison signal $V_{42}$ for three seconds, it delivers an etching completion signal ST to the etching device 40. In the range as indicated by B in FIG. 3, where the voltage exceeds $-1.35$ V only for a brief period, the comparison signal $V_{42}$ of the comparator ceases to exist before the setting time elapses, thereby causing the timer circuit 44 to be reset. Thus, the timer circuit 44 delivers no etching completion signal ST to the etching device. It is thus possible to accurately determine the completion of the etching operation by means of these operations.

In the range as indicated by A in FIG. 3 the voltage exceeding $-1.35$ V continues for about 3 minutes, there being a possibility that the completion of the etching operation will be erroneously detected. In order to prevent such an occurrence, another timer is provided which is adapted to start the comparator 42 at a predetermined time period (for example, 5 minutes in this case) after the etching operation is started. This timer is omitted in FIG. 4 for simplicity.

Figure 5:
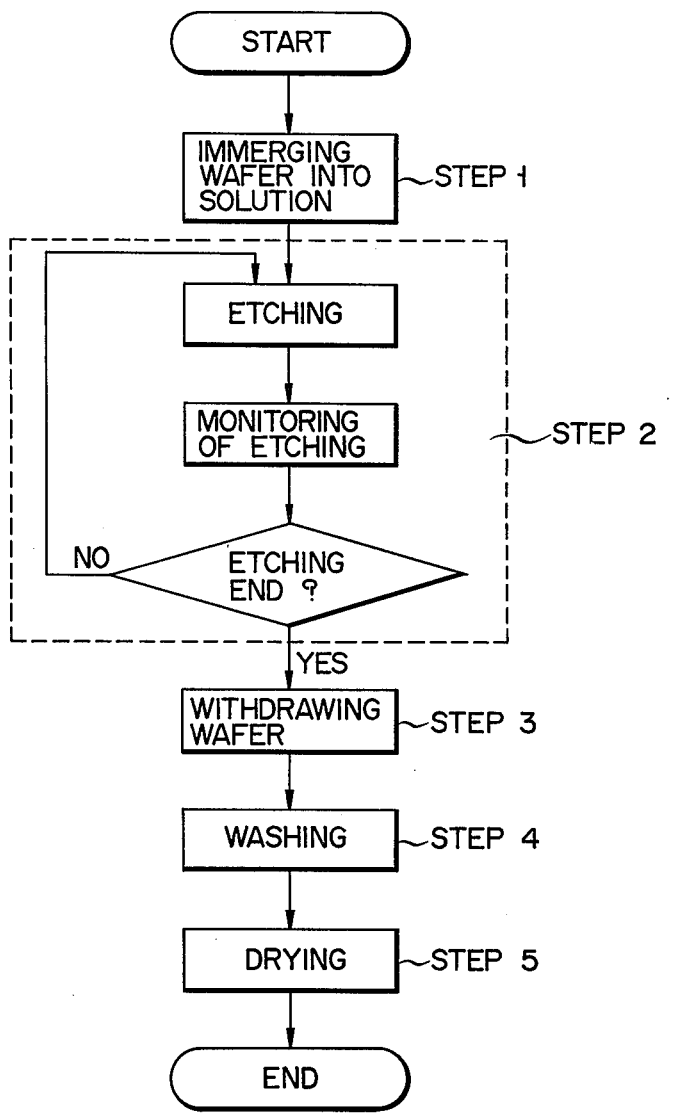
FIG. 5 shows a flow chart for explaining the operation of the etching system as shown in FIG. 4.

FIG. 5 shows a flow chart for explaining the system of FIG. 4. At step 1, the semiconductor wafer having a metal film to be etched is immersed in the etching solution to start an etching operation. At step 2, it is determined whether or not the etching operation is completed while checking the depth of etching. The etching operation continues until completion. If the completion of the etching operation is detected, the semiconductor wafer is raised from the etching solution at step 3. At step 4 the semiconductor wafer is washed and at step 5 it is dried. It is to be noted that in the system as shown in FIG. 4 the washing and drying steps are omitted. A conventional means can be adopted to perform such washing and drying steps.

According to this invention, the etching operation is performed while automatically checking the state of etching by utilizing the change of a voltage difference which is created between the metal electrode and the metal film on the semiconductor wafer in the etching solution. Thus, the etching operation is not timeconsuming. Even if the temperature of the etching solution varies somewhat, the system of this invention suffers no adverse effects resulting from a variation in the depth of etching. This obviates the necessity of strictly controlling the temperature of the etching solution. The system of this invention also suffers no adverse influence resulting from the deterioration of the etching solution. Even if the thickness of the metal film to be etched varies from wafer to wafer, the system of this invention suffers no adverse effects. It is thus possible to obtain a desired pattern under proper control of the etching operation.

Although the aluminium film on the semiconductor wafer is etched in the embodiment of this invention, it is also possible to use another metal film in place of the above-mentioned aluminium film. Instead of the platinum electrode, an electrode made of another metal may be used. Even if a multi-layer structure made of different metals is to be etched, the system of this invention may also be applied thereto. Needless to say, the setting time of the timer circuit 44, the value of the reference voltage, etc. can be set to different values according to the kinds of electrode metals, kinds of metal films to be etched, composition of the etching solution, etc.

What we claim is:

1. A system for monitoring the completion of etching away of a selected area of a metal film on a semiconductor wafer by immersing the metal film in an etching solution, which comprises:

voltage detecting means for detecting an etching voltage created between a metal electrode and the metal film on the semiconductor wafer which are both immersed in the etching solution;

comparator means for comparing a reference voltage with the voltage detected by the voltage detecting means and for continuously producing an output signal while the detected etching voltage exceeds the reference voltage; and timer means for starting a time count operation upon receipt of the output signal from the comparator means and for producing an etching completion signal when the output signal ceases.

2. The system of claim 1 wherein the cessation of said output signal resets said timer means.

3. The system of claim 1 wherein said timer means issues a signal after a predetermined period without cessation of said output signal.

* * * * *